United States Patent
Unno et al.

(10) Patent No.: US 12,170,190 B2
(45) Date of Patent: Dec. 17, 2024

(54) WAFER SUPPORT TABLE AND RF ROD

(71) Applicant: NGK Insulators, Ltd., Nagoya (JP)

(72) Inventors: Yutaka Unno, Handa (JP); Tomohiro Hara, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 169 days.

(21) Appl. No.: 18/047,713

(22) Filed: Oct. 19, 2022

(65) Prior Publication Data

US 2023/0058637 A1    Feb. 23, 2023

Related U.S. Application Data

(63) Continuation of application No. PCT/JP2022/009916, filed on Mar. 8, 2022.

(30) Foreign Application Priority Data

Apr. 1, 2021  (JP) ................... 2021-062560

(51) Int. Cl.
*H01T 23/00*    (2006.01)
*C23C 16/458*    (2006.01)
(Continued)

(52) U.S. Cl.
CPC .... *H01J 37/32724* (2013.01); *C23C 16/4586* (2013.01); *H01L 21/6833* (2013.01); *C23C 16/505* (2013.01); *H01J 2237/2007* (2013.01)

(58) Field of Classification Search
None
See application file for complete search history.

(56) References Cited

U.S. PATENT DOCUMENTS 5,995,357 A     11/1999    Ushikoshi et al.
11,469,129 B2 *  10/2022    Takahashi ......... H01L 21/67103
(Continued)

FOREIGN PATENT DOCUMENTS

JP    H03-145084 A    6/1991
JP    3790000 B2    6/2006
(Continued)

OTHER PUBLICATIONS

English translation of the International Preliminary Report on Patentability (Chapter I) dated Oct. 12, 2023 (Application No. PCT/JP2022/009916).
(Continued)

*Primary Examiner* — Stephen W Jackson
(74) *Attorney, Agent, or Firm* — BURR PATENT LAW, PLLC

(57) ABSTRACT

A wafer support table includes a ceramic base having a wafer placement surface and including an RF electrode and a heater electrode embedded, the RF electrode being closer to the wafer placement surface; a hole extending from a surface of the ceramic base opposite the wafer placement surface toward the RF electrode; and an RF rod through having a top end joined to the RF electrode or joined to a conductive member connected to the RF electrode, wherein the RF rod is a hybrid rod including a first rod member that is made of Ni and constitutes a portion of the RF rod from the top end to a predetermined position and a second rod member that is joined to the first rod member and constitutes a portion of the RF rod from the predetermined position to the base end and is made of a non-magnetic material.

9 Claims, 10 Drawing Sheets

(51) Int. Cl.
*H01J 37/32* (2006.01)
*H01L 21/683* (2006.01)
*C23C 16/505* (2006.01)

(56) References Cited

U.S. PATENT DOCUMENTS

| | | | |
|---|---|---|---|
| 11,499,229 B2* | 11/2022 | Ramalingam | C23C 16/4586 |
| 11,764,039 B2* | 9/2023 | Takahashi | H01L 21/68735 |
| | | | 219/444.1 |
| 2017/0278682 A1 | 9/2017 | Lin et al. | |
| 2017/0278732 A1 | 9/2017 | Amano | |
| 2018/0218885 A1* | 8/2018 | Maeda | H01J 37/32724 |
| 2018/0310362 A1 | 10/2018 | Tsuchida | |
| 2019/0088517 A1 | 3/2019 | Kosakai et al. | |
| 2020/0013586 A1 | 1/2020 | Ma et al. | |
| 2020/0135526 A1* | 4/2020 | Takahashi | H01L 21/6831 |
| 2022/0254662 A1* | 8/2022 | Matsushita | H01L 21/67248 |

FOREIGN PATENT DOCUMENTS

| | | |
|---|---|---|
| JP | 2016-143795 A | 8/2016 |
| JP | 2017-119593 A | 7/2017 |
| JP | 2017-183329 A | 10/2017 |
| KR | 10-2017-0088352 A | 8/2017 |
| KR | 10-2021-0018517 A | 2/2021 |
| WO | 2016/080502 A1 | 5/2016 |

OTHER PUBLICATIONS

International Search Report and Written Opinion (Application No. PCT/JP2022/009916) dated Jun. 7, 2022 (with English translation).
Korean Office Action (with English translation) dated Apr. 24, 2024 (Application No. 10-2022-7039414).

* cited by examiner

WAFER SUPPORT TABLE AND RF ROD

BACKGROUND OF THE INVENTION

1. Field of the Invention

The present invention relates to a wafer support table and an RF rod.

2. Description of the Related Art

A known ceramic wafer support table that is used, for example, to form a film on a wafer by plasma CVD has an RF rod connected to an RF electrode embedded in the ceramic base. For example, PTL 1 describes a wafer support table in which a conductive member connected to the RF electrode with a low thermal expansion member in between and an RF rod made of Ni are connected to each other to reduce a difference in thermal expansion and a difference in stress between the components, which leads to less detachment of the components.

CITATION LIST

Patent Literature

PTL 1: JP 3790000 B

SUMMARY OF THE INVENTION

However, the amount of radio-frequency power supplied to the RF electrode significantly increases in recent years, resulting in an increase in the amount of the radio-frequency current flowing through the RF rod. The radio-frequency power supplied to the wafer support table overheats the RF rod with the radio-frequency current, excessively increasing the temperature of a portion of the wafer support table directly above the RF rod. Furthermore, the connection between the RF electrode and the RF rod heated to a high temperature prevents a difference in thermal expansion and a difference in stress between the RF electrode and the conductive member, which are embedded in the wafer support table, from being sufficiently reduced, generating a problem such as detachment of the RF electrode and the conductive member from each other. The problem prevents medium- and long-term use of the wafer support table.

The present invention is made to solve the above-described problem, and a main object of the invention is to provide a wafer support table in which a portion of the wafer support table directly above the RF rod is less likely to be heated to an excessively high temperature to enable medium- to long-term use of the wafer support table.

A wafer support table according to the present invention includes: a ceramic base having a wafer placement surface and including an RF electrode and a heater electrode embedded, the RF electrode being closer to the wafer placement surface; a hole extending from a surface of the ceramic base opposite the wafer placement surface toward the RF electrode; and an RF rod through which radio-frequency power is supplied to the RF electrode and having a top end joined to the RF electrode exposed to a bottom of the hole or joined to a conductive member connected to the RF electrode, wherein the RF rod is a hybrid rod including a first rod member that is made of Ni and constitutes a portion of the RF rod from the top end to a predetermined position located between the top end and a base end and a second rod member that is joined to the first rod member and constitutes a portion of the RF rod from the predetermined position to the base end, and the second rod member is made of a non-magnetic material.

The wafer support table according to the present invention is a hybrid rod including the first rod member, which is made of Ni and constitutes a portion of the RF rod from the top end to the predetermined position located between the top end and the base end, and the second rod member that is made of a non-magnetic material and constitutes a portion of the rod from the predetermined position to the base end. The second rod member is made of a non-magnetic material and thus is less likely to produce heat and to be heated to a high temperature by radio-frequency power supplied thereto than a second rod member made of Ni. Thus, the overall rod is less likely to be heated to a high temperature and does not prevent heat release from the ceramic base. Accordingly, the wafer support table according to the present invention is less likely to heat a portion of the wafer directly above the rod connected to the RF electrode to an excessively high temperature. With this configuration, the RF electrode and the conductive member are less likely to be detached from each other, enabling medium- and long-term use.

In the wafer support table according the present invention, the predetermined position is determined by using a rod made of Ni, instead of the hybrid rod, and is a position where $T(x)$ represented by $T(x)=T_s-(\Delta T/L)*x$ is greater than or equal to the Curie temperature of Ni and lower than or equal to the oxidation temperature of the non-magnetic material, where $T_s$ [° C.] is a temperature of the heater electrode (provided that $T_s$ exceeds the Curie temperature of Ni), $L$ [cm] is a length of the rod made of Ni, $\Delta T$ [° C.] is a difference in temperature between ends of the rod made of Ni, $x$ [cm] is a length of the rod made of Ni from the top end to the predetermined position, and $T(x)$ [° C.] is a temperature of the rod made of Ni at the predetermined position. The portion from the top end to the predetermined position determined as above, or the first rod member, is made of Ni and is not magnetic at the Curie temperature or above, reducing an increase in impedance. The portion from the predetermined position determined as above to the base end, or the second rod member, is made of a non-magnetic material, reducing an increase in impedance. Furthermore, the temperature is lower than or equal to the oxidation temperature of the non-magnetic material, preventing oxidization of the second rod member.

In the wafer support table according to the present invention, the second rod member may have at an end thereof a protrusion tapered to gradually decrease in width toward the base end of the RF rod, and the protrusion of the second rod member may fit in a recess at an end of the first rod member to form the RF rod. In this configuration, when a load is applied to the RF rod due to repeated heating and cooling, the second rod member is less likely to be disconnected from the first rod member, because the side surface of the protrusion is caught on the side surface of the recess.

In the wafer support table according to the present invention, the first rod member may have at an end thereof a protrusion tapered to gradually decrease in width toward the top end of the RF rod, and the protrusion of the first rod member may fit in a recess at an end of the second rod member to form the RF rod. In this configuration, when a load is applied to the RF rod due to repeated heating and cooling, the second rod member is less likely to be disconnected from the first rod member, because the side surface of the protrusion is caught on the side surface of the recess.

In the wafer support table according to the present invention, the second rod member may be made of tungsten. In this configuration, the second rod member is less likely to be oxidized when the second rod member is heated by the heat transferred from the first rod member heated to the Curie temperature of Ni (about 360° C.) or above, and thus the RF rod is less likely to be degraded by oxidization.

In the wafer support table according to the present invention, the RF rod may have a hollow section. This configuration reduces the weight of the RF rod, allowing easy handling. Due to the skin effect, radio-frequency current flows on the outer peripheral surface, not on the inner peripheral side of the RF rod, and thus the impedance is not changed when the RF rod has the hollow portion. Furthermore, the RF rod has a smaller cross-sectional area, and thus less heat is transferred from the wafer support table. In this case, the second rod member may have the hollow section, and a peripheral wall defining the hollow section may be made of tungsten ribbon or tungsten mesh. This configuration increases the flexibility of the RF rod itself. This reduces a load applied to the ceramic base through the RF rod when the wafer support table is used.

In the wafer support table according to the present invention, the first rod member may have a narrow portion near a top end thereof. This configuration increases the flexibility of the RF rod. This reduces a load applied to the ceramic base through the RF rod when the wafer support table is used. The RF rod preferably has a diameter of 2 to 10 mm.

Here, the narrow portion is a portion having a smaller diameter than the other portion. The narrow portion is a portion, for example, having an outer peripheral surface in an arc-shape when the first rod member is cut along a plane extending in the longitudinal direction through the center.

An RF rod according to the present invention is a hybrid rod and includes: a first rod member that is made of Ni and constitutes a portion from a top end to a predetermined position located between the top end and a base end and a second rod member that is joined to the first rod member and constitutes a portion from the predetermined position to the base end, wherein the second rod member is made of a non-magnetic material.

It is highly worth applying the RF rod to the wafer support table of the present invention.

DETAILED DESCRIPTION OF THE INVENTION

Figure 1:
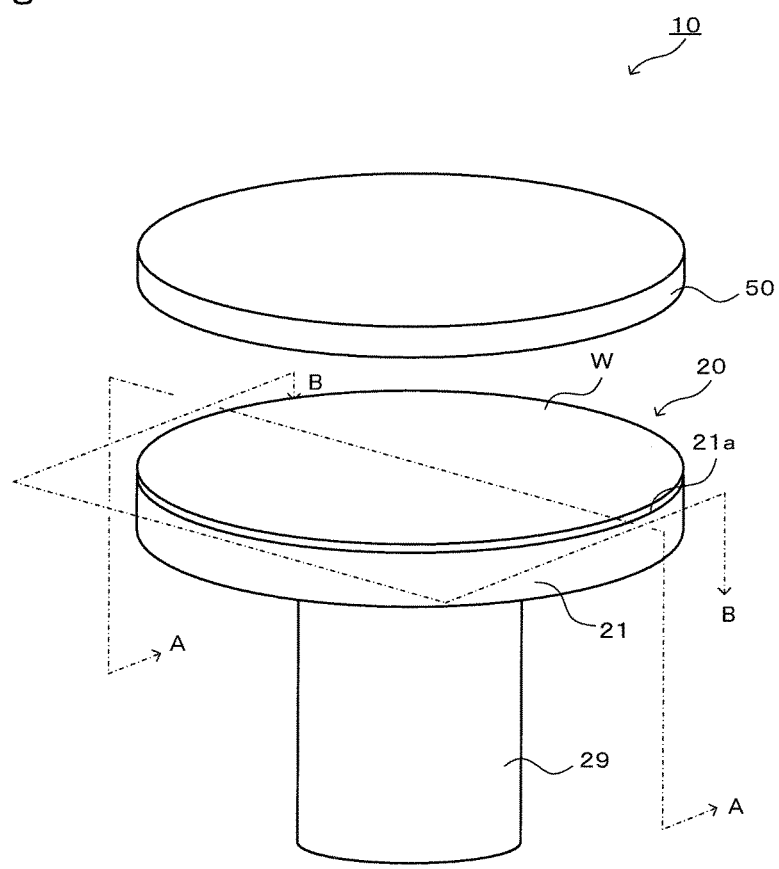
FIG. 1 is a perspective view of a plasma generator 10.
Figure 2:
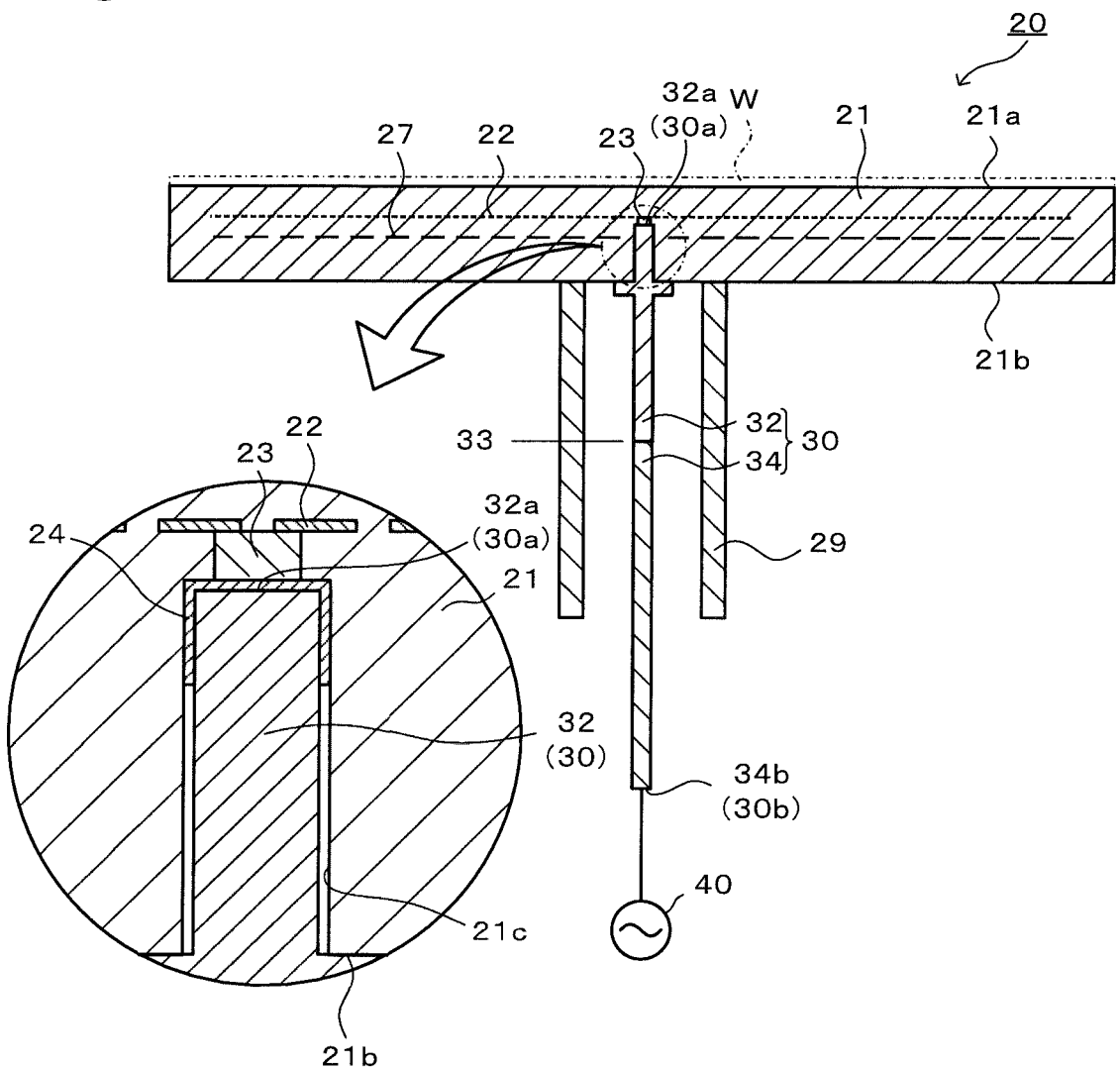
FIG. 2 is a sectional view taken along line A-A in FIG. 1.
Figure 3:
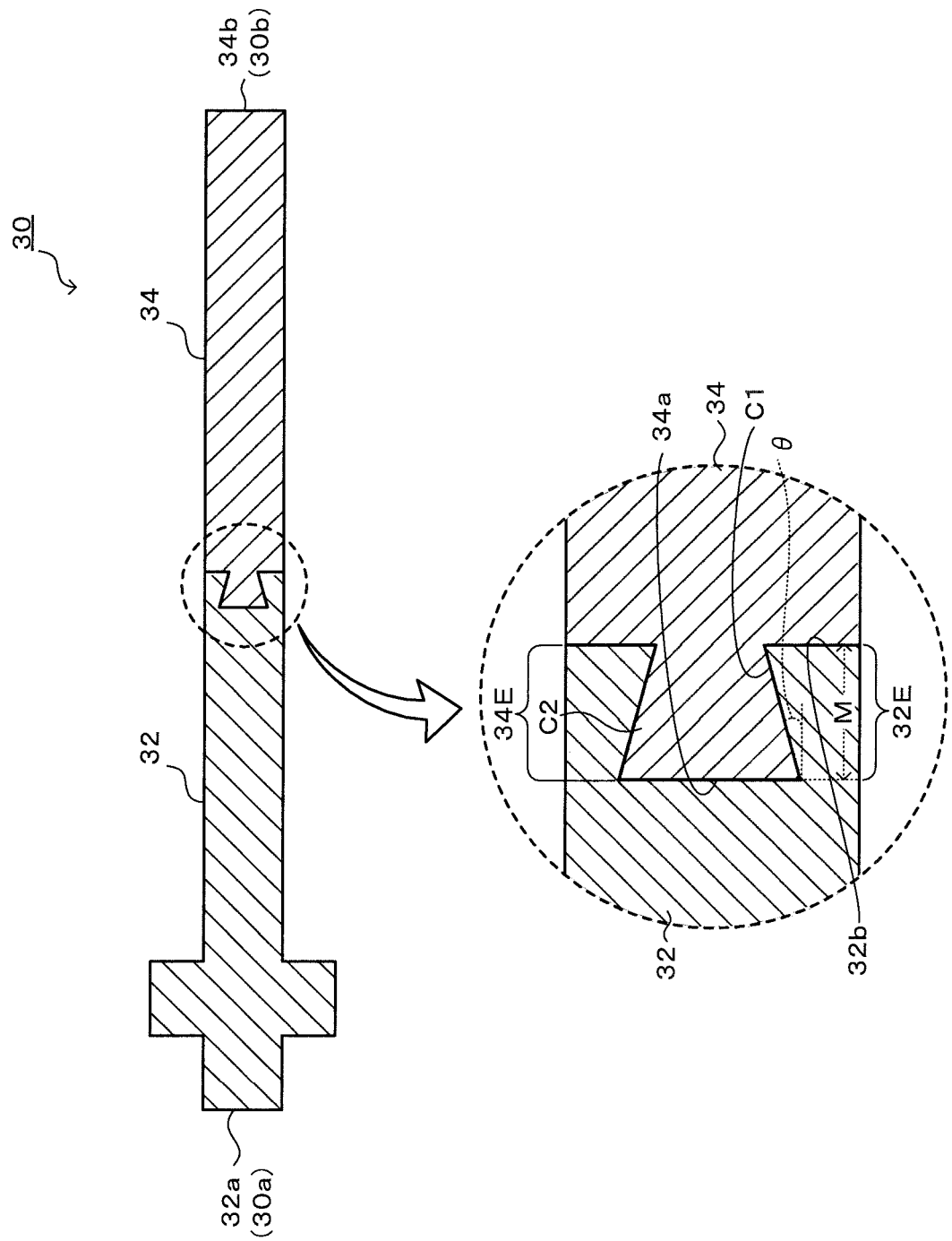
FIG. 3 is a sectional view of an RF rod 30 taken in the longitudinal direction.
Figure 4:
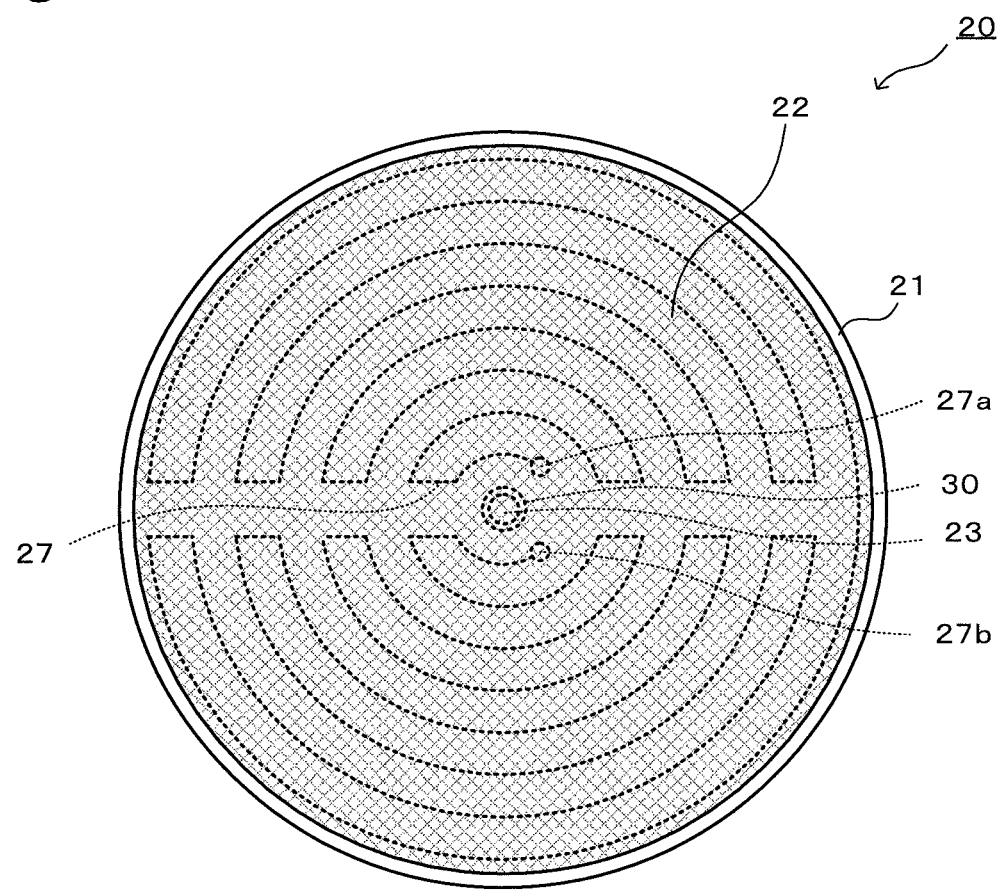
FIG. 4 is a sectional view taken along line B-B in FIG. 1.

A preferred embodiment of the present invention will be described below with reference to the drawings. FIG. 1 is a perspective view of a plasma generator 10, FIG. 2 is a sectional view taken along line A-A in FIG. 1, FIG. 3 is a sectional view of an RF rod 30 taken in the longitudinal direction, and FIG. 4 is a sectional view taken along line B-B in FIG. 1.

As illustrated in FIG. 1, the plasma generator 10 includes a wafer support table 20 and an upper electrode 50.

The wafer support table 20 is used to support and heat a wafer W on which CVD or etching is performed with plasma. The wafer support table 20 is mounted in a semiconductor processing chamber (not illustrated). The wafer support table 20 includes a ceramic base 21 and a ceramic shaft 29 that is a hollow member.

The ceramic base 21 is a disc-like component made of ceramic (here, aluminum nitride). The ceramic base 21 has a wafer placement surface 21a on which a wafer W can be placed. The ceramic shaft 29 is attached to a middle of a surface (rear surface) 21b opposite the wafer placement surface 21a of the ceramic base 21. As illustrated in FIG. 2, an RF electrode 22 and a heater electrode 27 are embedded in the ceramic base 21 with a space therebetween. The RF electrode 22 and the heater electrode 27 are parallel (including substantially parallel, the same applies hereinafter) to the wafer placement surface 21a and are embedded in the ceramic base 21. The RF electrode is closer to the wafer placement surface 21a. The ceramic base 21 has a hole 21c extending from the rear surface 21b toward the RF electrode 22. The conductive member 23 connected to the RF electrode 22 is exposed to the bottom of the hole 21c.

The RF electrode 22 is a disc-like thin-layer electrode having a slightly smaller diameter than the ceramic base 21 and is a mesh sheet made of woven thin metal wires composed mainly of Mo. The conductive member 23 having a disc-like shape is electrically connected to a substantially middle of the RF electrode 22. The conductive member 23 is exposed to the bottom of the hole 21c opening in the rear surface 21b of the ceramic base 21. The material of the conductive member 23 is Mo, which is the same as the RF electrode 22.

The heater electrode 27 is a coil composed mainly of Mo and arranged over the entire surface of the ceramic base 21 in a one-stroke pattern. Heater rods (not illustrated) are connected to respective ends 27a and 27b (see FIG. 4) of the heater electrode 27. The heater rods are connected to an external power source (not illustrated) through the inner space of the ceramic shaft 29.

The RF electrode 22, the conductive member 23, and the heater electrode 27 are made of Mo, because the thermal expansion coefficient thereof is close to that of the material of the ceramic base 21 (here, AlN) and thus a crack is less likely to be generated during production of the ceramic base 21. The RF electrode 22, the conductive member 23, and the heater electrode 27 may be made of any material that has a thermal expansion coefficient closer to that of AlN, instead of Mo. A thermocouple (not illustrated) is inserted into an area of the rear surface 21b of the ceramic base 21 surrounded by the ceramic shaft 29 to measure the temperature of the ceramic base 21.

The ceramic shaft 29 is a cylindrical component made of the same ceramic as the ceramic base 21. The upper end face of the ceramic shaft 29 is attached to the rear surface 21b of the ceramic base 21 by diffusion bonding or thermal compression bonding (TCB). TCB is a known technique including inserting a metal joint member between two components to be joined and pressure bonding the two components while heating to a temperature lower than or equal to the solidus temperature of the metal joint member.

The RF rod 30 is a solid cylindrical hybrid rod including a first rod member 32 that forms a portion of the RF rod 30 from a top end 30a to a predetermined position 33 located between the top end 30a and a base end 30b and a second rod member 34 that is joined to the first road member 32 and forms a portion of the RF rod 30 from the predetermined position 33 to the base end 30b. How to determine the predetermined position 33 will be described later. The first rod member 32 is a bar-like component made of Ni. The second rod member 34 may be made of a non-magnetic material having a lower impedance than Ni and may be, for example, a bar-like component made of tungsten. As illustrated in FIG. 3, a protrusion C2 in a joint section 34E of the second rod member 34 fits in a recess C1 in a joint section 32E of the first rod member 32 to form the RF rod 30. The protrusion C2 is tapered to gradually decrease in diameter or width toward the base end 34b of the second rod member 34 (the base end 30b of the RF rod 30). The protrusion C2 has a circular or rectangular cross-sectional shape. The taper angle θ of the protrusion C2 may be any angle that can prevent the second rod member 34 from being disconnected from the first rod member 32 due to a difference in thermal expansion between the first rod member 32 and the second rod member 34 and is preferably less than or equal to 1 degree, for example. Furthermore, the protrusion length M is preferably greater than or equal to 10 mm to prevent the joint between the first rod member 32 and the second rod member 34 from becoming loose. Furthermore, the protrusion length M is preferably less than or equal to 50 mm to enable easy processing and to enable firm integration between the first rod member 32 and the second rod member 34. As illustrated in FIG. 2, the top end 30a of the RF rod 30 (or the top end 32a of the first rod member 32) is joined to the conductive member 23 of the RF electrode 22 with a brazing portion 24 therebetween. The base end 30b of the RF rod 30 (or the base end 34b of the second rod member 34) is connected to an RF power source 40. The radio-frequency power is supplied from the RF power source 40 to the RF electrode 22 through the RF rod 30.

As illustrated in FIG. 1, the upper electrode 50 is fixed to a position above the wafer placement surface 21a (for example, a ceiling surface of a chamber (not illustrated)) and faces the wafer placement surface 21a of the ceramic base 21. The upper electrode 50 is grounded.

Figure 5:
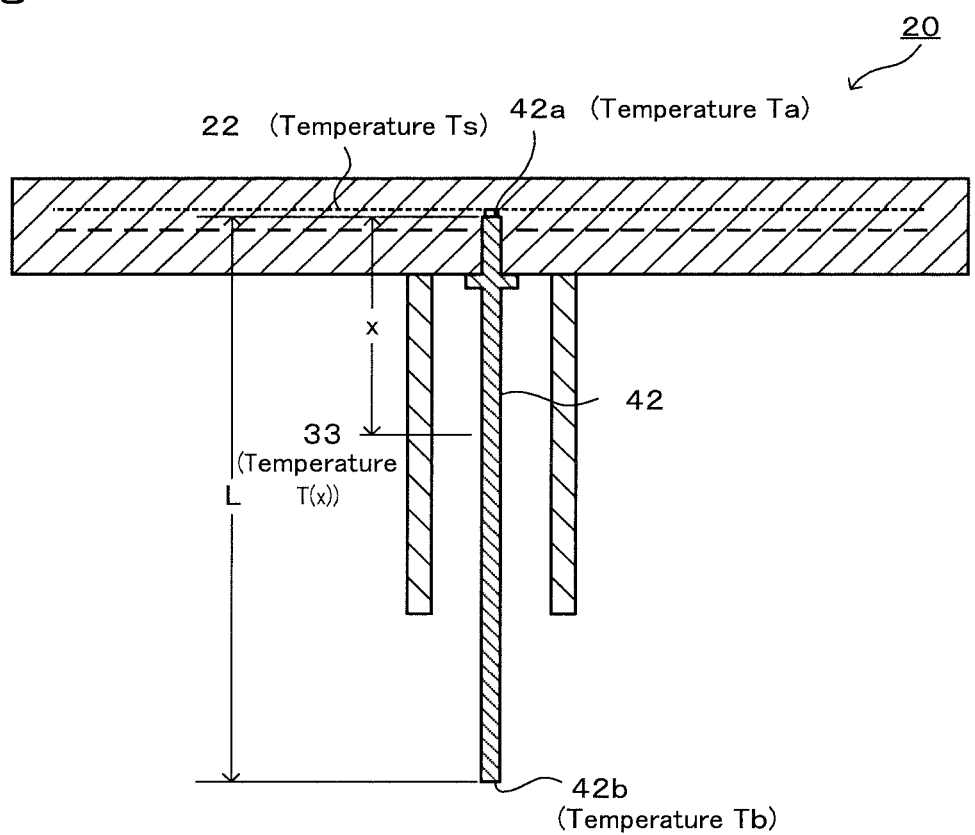
FIG. 5 is a view for explaining how a predetermined position 33 is determined.
Figure 6:
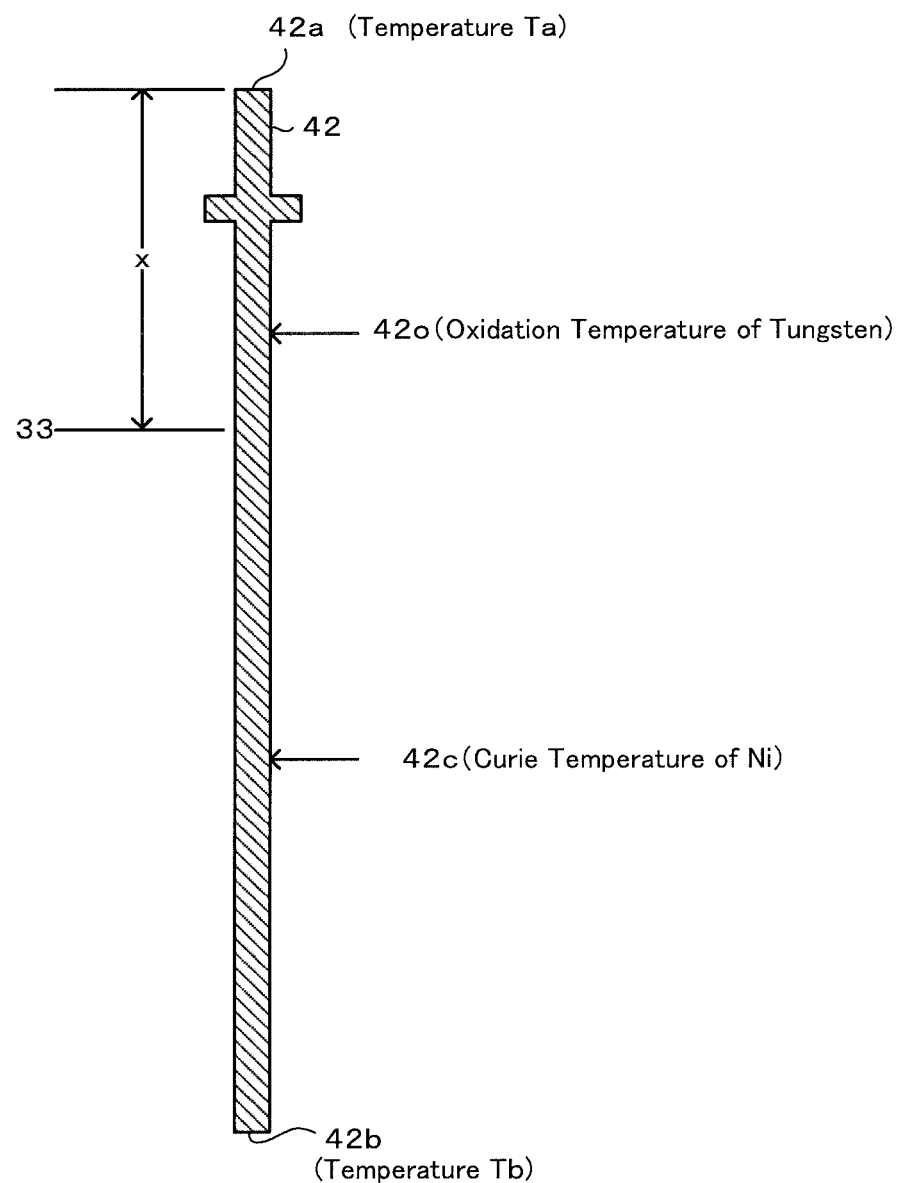
FIG. 6 is a view for explaining how the predetermined position 33 is determined.

Here, the predetermined position 33 is determined as described below. As illustrated in FIG. 5, instead of the RF rod 30 (hybrid rod), a rod 42 made of Ni is attached to the wafer support table 20. Then, let the temperature of the heater electrode 27 be Ts [° C.] (provided that Ts is a temperature above the Curie temperature of Ni), the length of the rod 42 made of Ni be L [cm], a difference between the temperature Ta of the top end 42a and the temperature Tb of the base end 42b of the rod 42 made of Ni be ΔT (=Ta−Tb) [° C.], the length from the top end 42a (a portion connected to the RF electrode 22) to the predetermined position 33 of the rod 42 made of Ni be x [cm], and the temperature at the predetermined position 33 of the rod 42 made of Ni be T (x) [° C.]. Here, x [cm] is determined such that T (x) represented by formula (1) below becomes greater than or equal to 360° C., which is the Curie temperature of Ni, and lower than or equal to 400° C., which is the oxidation temperature of the non-magnetic material (tungsten). Specifically described, as illustrated in FIG. 6, the length x [cm] from the top end 42a is determined such that the predetermined position 33 is located between a first position 42c where the temperature of the rod 42 made of Ni corresponds to the Curie temperature (360° C.) of Ni and a second position 42o where the temperature of the rod 42 made of Ni corresponds to the oxidation temperature (400° C.) of the non-magnetic material (tungsten). The temperature Ta of the top end 42a of the rod 42 made of Ni is considered as substantially the same as the temperature Ts of the heater electrode 27.

$$T(x)=Ts-(\Delta T/L)*x \qquad (1)$$

Next, an example of how the plasma generator 10 is used is explained. The plasma generator 10 is positioned in a chamber (not illustrated) and a wafer W is placed on the wafer placement surface 21a. Then, the RF power source 40 supplies a radio-frequency power (for example, 13 to 30 MHz) to the RF electrode 22. This generates plasma between parallel plate electrodes composed of the upper electrode 50 and the RF electrode 22 embedded in the ceramic base 21, enabling CVD film formation and etching on the wafer W with plasma. Furthermore, the temperature of the wafer W is determined by using a detection signal from a thermocouple (not illustrated), and the voltage applied to the heater electrode 27 is controlled such that the temperature becomes the set temperature (for example, 450° C., 500° C., or 550° C.) The RF rod 30 through which the radio-frequency power is supplied to the RF electrode 22 has the second rod member 34 made of tungsten. In this configuration, when the second rod member 34 is heated by the heat transferred from the first rod member 32, the second rod member 34 is less likely to be oxidized than one made of Cu, for example.

Furthermore, the RF rod 30 of this embodiment includes the first rod member 32 made of Ni as a portion to be in a temperature range above the Curie temperature of Ni. In such a temperature range, the first rod member 32 is not magnetic, reducing an increase in impedance. Furthermore, if the entire RF rod 30 is made of tungsten, an increase in impedance can be reduced, but the RF rod 30 would be oxidized at 400° C. or above. In contrast, the RF rod 30 according to this embodiment includes the second rod member 34 made of a non-magnetic material as a portion to be in a temperature range below the oxidation temperature of tungsten. In such a temperature range, the second rod member 34 is not oxidized, reducing oxidation of the second rod member 34.

Next, an example of how the wafer support table 20 is produced is explained. First, a mold casting process is performed to form a ceramic molded article in which the conductive member 23 having a surface in contact with the RF electrode 22 and the heater electrode 27 are embedded. Here, the "mold casting process" is a process of forming a molded article by injecting a ceramic slurry that contains ceramic material powder and a molding agent into a molding die and causing a chemical reaction of the molding agent in the molding die to mold the ceramic slurry. Next, the ceramic molded article is subjected to hot press sintering to obtain the ceramic base 21. Next, a grinding process is performed to form holes, such as a hole 21c in the rear surface 21b of the ceramic base 21 to which a surface of the conductive member 23 opposite the surface in contact with the RF electrode 22 is exposed, a hole for receiving a heater rod to be connected to the heater electrode 27, and a hole for receiving the thermocouple. Next, the ceramic shaft 29 is joined to the rear surface 21b of the ceramic base 21 by TCB with the ceramic base 21 and the ceramic shaft 29 being coaxial. Next, the conductive member 23 and the RF rod 30 are brazed. Then, the heater electrode 27 and the heater rod are joined together, and the thermocouple is attached, to produce the wafer support table 20.

Figure 7A:
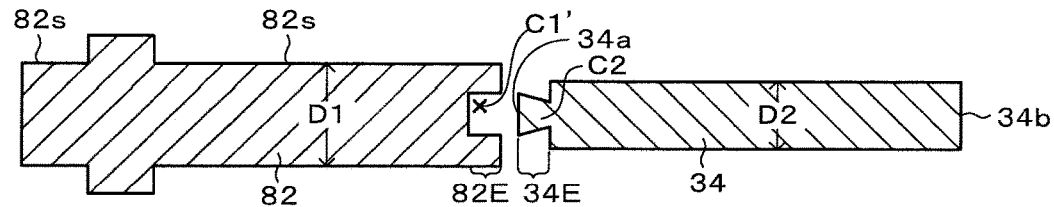
FIG. 7A is a view for explaining an example of a method of producing the RF rod 30.

Here, the RF rod 30 used in production of the wafer support table 20 is produced as follows. First, as illustrated in FIG. 7A, a first rod member forming member 82 and the second rod member 34 are provided. Specifically described, the process includes forming the first rod member forming member 82 that has a diameter D1 and has a recess C1' in a joint section 82E and forming the second rod member 34 that has a diameter D2 (D2<D1) and has a protrusion C2 in a joint section 34E. The recess C1' and the protrusion C2 are formed by grinding or cutting. The first rod member forming member 82 is a component finally made into the first rod member 32.

Figure 7B:
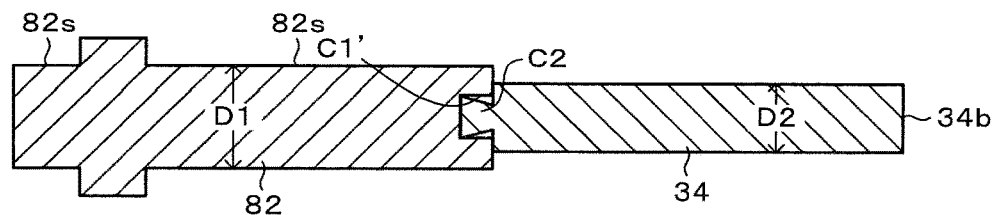
FIG. 7B is a view for explaining an example of a method of producing the RF rod 30.
Figure 7C:
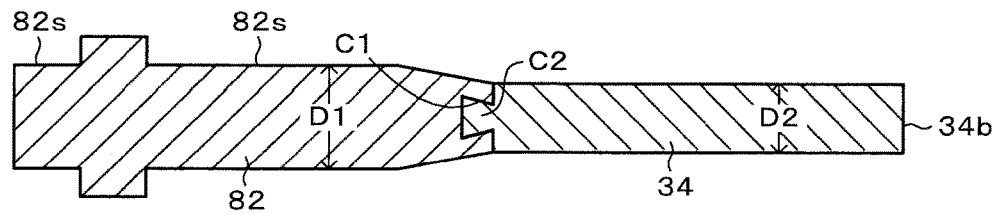
FIG. 7C is a view for explaining an example of a method of producing the RF rod 30.

Next, as illustrated in FIG. 7B, the protrusion C2 of the second rod member 34 is inserted into the recess C1' of the first rod member forming member 82. Next, as illustrated in FIG. 7C, the first rod member forming member 82 and the second rod member 34 are joined together. Specifically described, a force is externally applied to a portion of the first rod member forming member 82 around the recess C1' to plastically deform the portion around the recess C1', bringing the deformed recess C1' (recess C1) in strong contact with the protrusion C2. As a result, the protrusion C2 of the second rod member 34 fits in the recess C1 of the first rod member forming member 82, and thus the first rod member forming member 82 and the second rod member 34 are joined together.

Figure 7D:
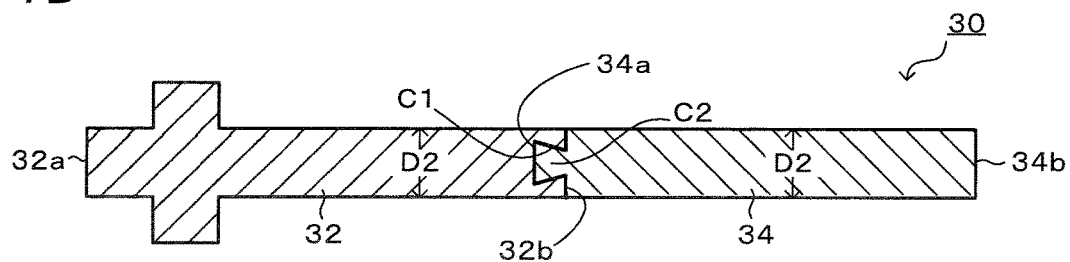
FIG. 7D is a view for explaining an example of a method of producing the RF rod 30.

Then, the diameter D1 of the first rod member forming member 82 is made small. Specifically described, a side surface 82s of the first rod member forming member 82 is cut or ground to reduce the diameter D1 of the first rod member forming member 82 to the diameter D2 of the second rod member 34. This makes the first rod member forming member 82 into the first rod member 32 as illustrated in FIG. 7D, and thus the RF rod 30 is produced. When the diameter D1 of the first rod member forming member 82 does not need to be reduced, this process may be eliminated.

In the wafer support table 20 described in detail above, the second rod member 34 is made of a non-magnetic material and thus is less likely to produce heat and less likely to be heated to a high temperature by radio-frequency power supplied thereto than a second rod member 34 made of Ni. Thus, the entire RF rod 30 is less likely to be heated to a high temperature and does not prevent heat release from the ceramic base 21. Accordingly, when the wafer support table 20 is used, a portion of the wafer directly above the RF rod 30 connected to the RF electrode 22 is less likely to be heated to an excessively high temperature. With this configuration, the RF electrode 22 and the conductive member 23 are less likely to be detached from each other, enabling medium- and long-term use.

Furthermore, the predetermined position 33 is determined by using a rod 42 made of Ni, instead of the RF rod 30 (hybrid rod), and is a position where T (x) represented by T (x)=Ts−(ΔT/L)*x is greater than or equal to the Curie temperature of Ni and lower than or equal to the oxidation temperature of the non-magnetic material (tungsten), where Ts [° C.] is a temperature of the heater electrode 27 (provided that Ts exceeds the Curie temperature of Ni), L [cm] is a length of the rod 42 made of Ni, ΔT [° C.] is a difference in temperature between ends of the rod 42 made of Ni, x [cm] is a length of the rod 42 made of Ni from the top end 42a to the predetermined position 33, and T (x) [° C.] is a temperature of the rod 42 made of Ni at the predetermined position 33. The portion of the RF rod 30 from the top end 30a to the predetermined position 33 determined as above, that is, the first rod member 32 is made of Ni and is not magnetic at the Curie temperature or above, reducing an increase in impedance. The portion from the predetermined position 33 determined as above to the base end 30b, that is, the second rod member 34, is made of a non-magnetic material, reducing an increase in impedance. Furthermore, the temperature is lower than or equal to the oxidation temperature of the non-magnetic material, preventing oxidization of the second rod member 34. The length x [cm] from the top end 42a to the predetermined position 33 of the rod 42 made of Ni is greater than or equal to 2 [cm] and less than or equal to 25 [cm] regardless of the length L [cm] of the rod 42 made of Ni.

Furthermore, the second rod member 34 has the protrusion C2 tapered to gradually decrease in width toward the base end 30b of the RF rod 30. The protrusion C2 of the second rod member 34 fits in the recess C1 at the end of the first rod member 32 to form the RF rod 30. In this configuration, when a load is applied to the RF rod 30 due to repeated heating and cooling, the second rod member 34 is less likely to be disconnected from the first rod 32, because the side surface of the protrusion C2 is caught on the side surface of the recess C1.

The second rod member 34 is made of tungsten. In this configuration, the second rod member 34 is less likely to be oxidized when the second rod member 34 is heated by the heat transferred from the first rod member 32 heated to the Curie temperature of Ni (about 360° C.) or above, and thus the RF rod 30 is less likely to be degraded by oxidization.

Furthermore, it is highly worth applying the RF rod 30 to the wafer support table 20.

The present invention is not limited to the above-described embodiment and can be implemented in various forms without departing from the technical scope of the present invention.

Figure 8:
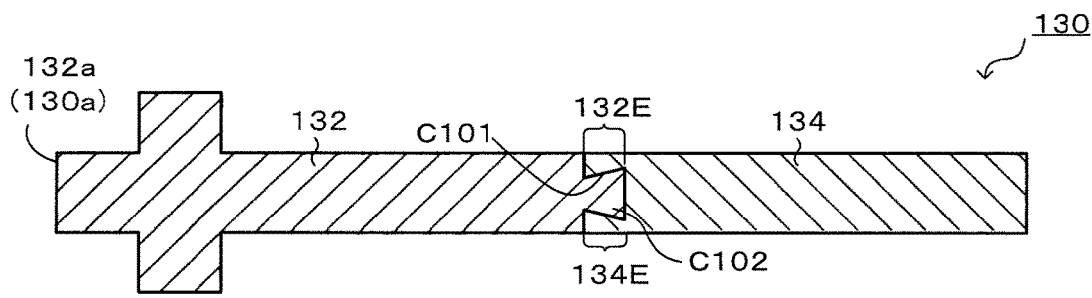
FIG. 8 is a sectional view of an RF rod 130.

For example, the RF rod 30 is not limited to one in the above-described embodiment in which the protrusion C2 of the second rod member 34 fits in the recess C1 of the first rod member 32. For example, as an RF rod 130 illustrated in FIG. 8, a protrusion C102 in a joint section 132E of a first rod member 132 may fit in a recess C101 in a joint section 134E of a second rod member 134. In such a case, the protrusion C102 is tapered to gradually decrease in width toward a top end 132a of the first rod member 132 (a top end 130a of the RF rod 130). In this configuration, when a load is applied to the RF rod 130 due to repeated heating and cooling, the second rod member 134 is less likely to be disconnected from the first rod member 132, because the side surface of the protrusion C102 is caught on the side surface of the recess C101.

Figure 9:
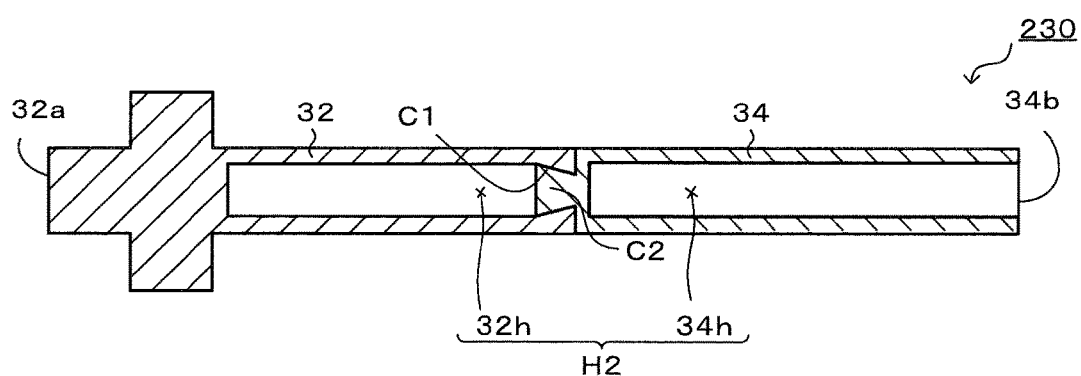
FIG. 9 is a sectional view of an RF rod 230.

In the above-described embodiment, instead of the RF rod 30, an RF rod 230 having a hollow portion H2 therein as illustrated in FIG. 9 may be employed. The first rod member 32 has a long hole 32h extending from the recess C1 toward the top end 32a. The second rod member 34 has a long hole 34h extending from the base end 34b toward the protrusion C2. The hollow portion H2 is constituted by the long hole 32h and the long hole 34h. This configuration reduces the weight of the RF rod 230, allowing easy handling. Due to the skin effect, radio-frequency current flows on the outer peripheral surface, not on the inner peripheral side of the RF rod, and thus the impedance is not changed when the RF rod 230 has the hollow portion. Furthermore, the RF rod 230 has a smaller cross-sectional area, and allows less heat transfer from the wafer support table 20.

Figure 10:
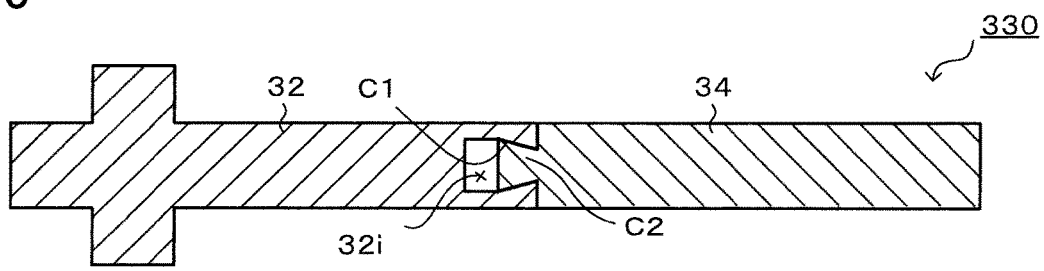
FIG. 10 is a sectional view of an RF rod 330.

In the above-described embodiment, instead of the RF rod 30, an RF rod 330 having an inner space 32i as illustrated in FIG. 10 may be employed. The space 32i is located between the bottom surface of the recess C1 and the top surface of the protrusion C2. In this configuration, the space 32i reduces heat transfer, enabling the temperature of the first rod member 32 to be kept high. This readily allows the first rod member 32 to be kept at the Curie temperature or above and allows less heat transfer to the second rod member 34, decreasing the temperature of the second rod member 34.

Figure 11:
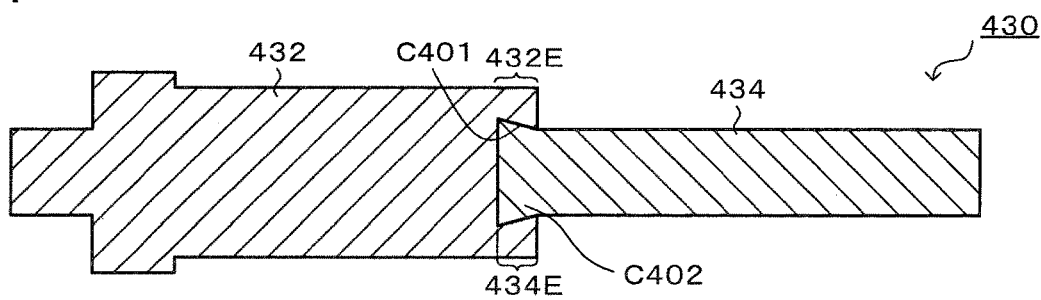
FIG. 11 is a sectional view of an RF rod 430.

In the above-described embodiment, instead of the RF rod 30, an RF rod 430 including a first rod member 432 wider than a second rod member 434 as illustrated in FIG. 11 may be employed. In such a case, as illustrated in FIG. 11, a protrusion C402 in a joint section 434E is wider than a portion of the joint section 434E other than the protrusion C402, and the protrusion C402 may fit in the recess C401 in the joint section 432E of the first rod member 432.

In the above-described embodiment, if the first rod member 32 and the second rod member 34 are not disconnected from each other by the difference in thermal expansion, the protrusion C2 of the second rod member 34 may have a solid cylindrical shape or a cuboidal shape instead of the tapered shape, and the protrusion C2 may be press-fitted into the recess C1 of the first rod member 32 to produce the RF rod 30.

Figure 12:
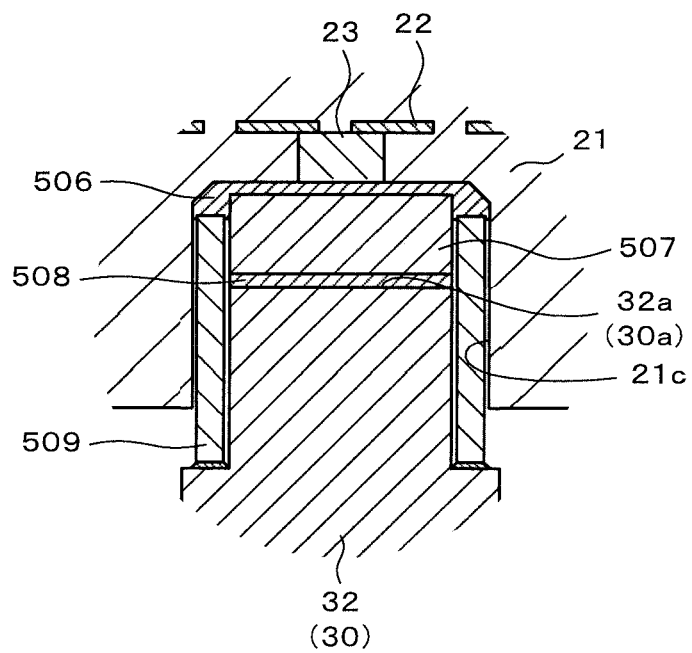
FIG. 12 is a sectional view illustrating how a conductive member 23 and the RF rod 30 are joined together.

In the above-described embodiment, the top end 32a of the first rod member 32 of the RF rod 30 is connected to the conductive member 23 exposed to the bottom of the hole 21c, but the configuration is not limited to this. For example, the conductive member 23 may be eliminated, and the RF electrode 22 may be exposed to the bottom of the hole 21c, and the exposed RF electrode 22 and the top end 30a of the RF rod 30 (the top end 32a of the first rod member 32) may be joined to each other. Alternatively, as illustrated in FIG. 12, the conductive member 23 and the RF rod 30 may be connected to each other with a low-thermal expansion member 507 disposed in between. The low-thermal expansion member 507 is a conductor made of a material having a thermal expansion coefficient of at least less than or equal to $8.0 \times 10^{-1}$/° C. at 400° C. or below, such as molybdenum, tungsten, a molybdenum-tungsten alloy, a tungsten-copper-nickel alloy, or Kovar. In such a case, the hole 21c has a larger width than the top end 32a, and a cylindrical atmosphere-shielding member 509 is inserted in the hole 21c. The atmosphere-shielding member 509 may be made of pure nickel, a nickel-based heat-resistant alloy, gold, platinum, silver, or an alloy thereof. Furthermore, a small space is provided between the outer surface of the atmosphere-shielding member 509 and the inner surface of the hole 21c. Furthermore, the inner space of the atmosphere-shielding member 509 accommodates the disc-like low-thermal expansion member 507. The low-thermal expansion member 507 and the bottom of the hole 21c, and the low-thermal expansion member 507 and the conductive member 23, are joined to each other, respectively, with conductive joining layers 506 and 508, and the atmosphere-shielding member 509 and the bottom of the hole 21c are joined to each other with the conductive joining layer 506.

In the above-described embodiment, the RF electrode 22 is in a mesh form but may be in another form. For example, a coil form, a planar form, or a perforated metal may be employed.

In the above-described embodiment, AlN is employed as a ceramic material, but the ceramic material is not limited to this. For example, alumina may be employed. In such a case, the RF electrode 22, the conductive member 23, and the heater electrode 27 are each preferably made of a material having a thermal expansion coefficient closer to that of the ceramic.

In the above-described embodiment, a DC voltage may be applied across the RF electrode 22 to attract the wafer W to the wafer placement surface 21a. The ceramic base 21 may further have an electrostatic electrode embedded therein, and a DC voltage may be applied across the electrostatic electrode to attract the wafer W to the wafer placement surface 21a.

Figure 13:
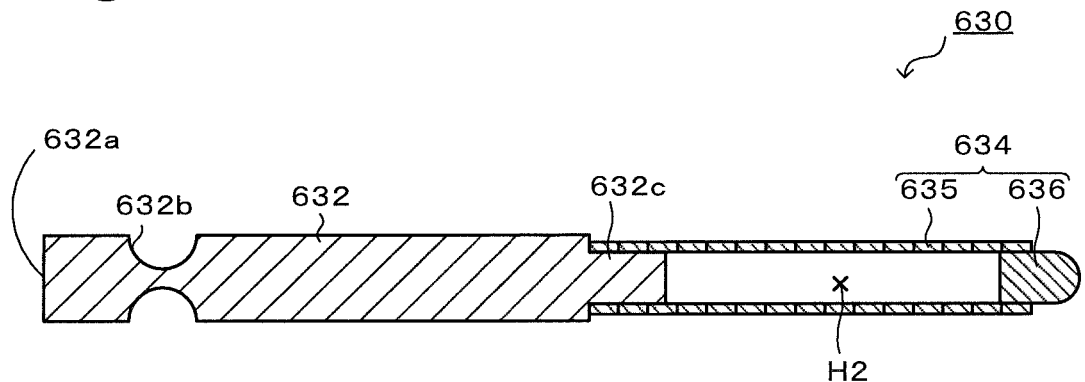
FIG. 13 is a sectional view of an RF rod 630.

In the above-described embodiment, instead of the RF rod 30, an RF rod 630 illustrated in FIG. 13 may be employed. The RF rod 630 includes a first rod member 632 and a second rod member 634. The first rod member 632 has a narrow portion 632b near a top end 632a and a protrusion 632c at the opposite end from the top end 632a. The smallest outer diameter of the narrow portion 632b is preferably greater than or equal to 2 mm and less than or equal to 5 mm. This provides sufficient flexibility and can readily reduce local heat generation in the second rod member 634. The reduction in local heat generation in the second rod member 634 readily allows the wafer placement surface 21a to maintain temperature uniformity. The protrusion 632c is a solid cylindrical portion having a smaller diameter than the first rod member 632, except for the narrow portion 632b. The second rod member 634 has a peripheral wall 635 and a solid portion 636. The peripheral wall 635 is made of wound tungsten ribbon. The tungsten ribbon forming the peripheral wall 635 preferably has a thickness of greater than or equal to 0.1 mm and less than or equal to 0.5 mm. The width of the tungsten ribbon is preferably greater than or equal to 1 mm and less than or equal to 10 mm. This provides sufficient flexibility and enables the entire RF rod 630 to have sufficient electrical conductivity. The peripheral wall 635 defines the hollow portion H2. At the front end of the peripheral wall 635, the tungsten ribbon is wound around and brazed to the outer surface of the protrusion 632c. At the end of the peripheral wall 635 opposite from the front end, the tungsten ribbon is wound around and brazed to the solid portion 636. The solid portion 636 is a bar-like component made of tungsten. The RF rod 630 has the first rod member 632 having the narrow portion 632b and has the second rod member 634 having the peripheral wall 635 made of tungsten ribbon. This increases the flexibility of the RF rod 630, reducing a load applied to the ceramic base through the RF rod 630 when the wafer support table is used. The wafer support table 20 is mounted in a film forming apparatus by using an attachment member before use. The attachment member may be a member having an insertion hole that receives and retains the RF rod 630. Since the RF rod 630 has high flexibility, the wafer support table 20 allows the RF rod 630 to be readily inserted into the insertion hole of the attachment member when mounted in a film forming apparatus. Thus, the wafer support table 20 is readily mounted in a film forming apparatus. The solid portion 636 may be eliminated from the second rod member 634. The peripheral wall 635 of the RF rod 630 may be made of a tungsten mesh. This configuration not only provides the above-described effects but also increases the surface area of the peripheral wall 635 defining the hollow portion H2, readily reducing an increase in the temperature of the second rod member 634.

Furthermore, this configuration provides not only the above-described effects but also reduces the weight of the RF rod 630, allowing easy handling.

Figure 14:
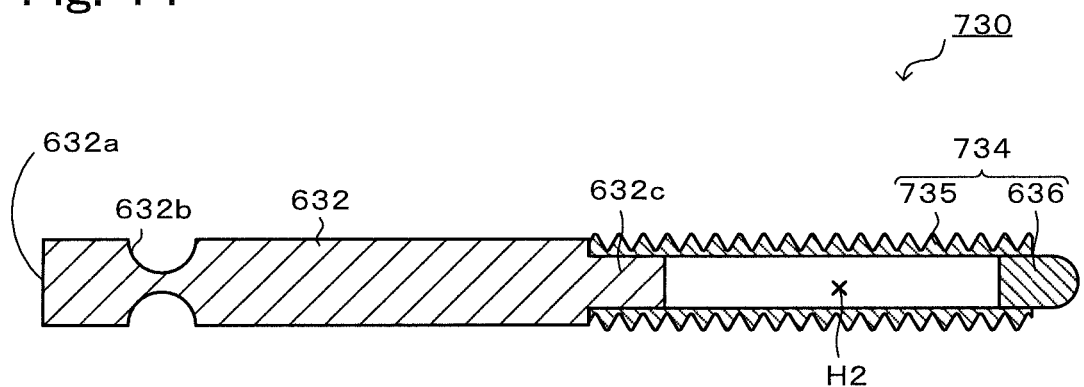
FIG. 14 is a sectional view of an RF rod 730.
Figure 15:
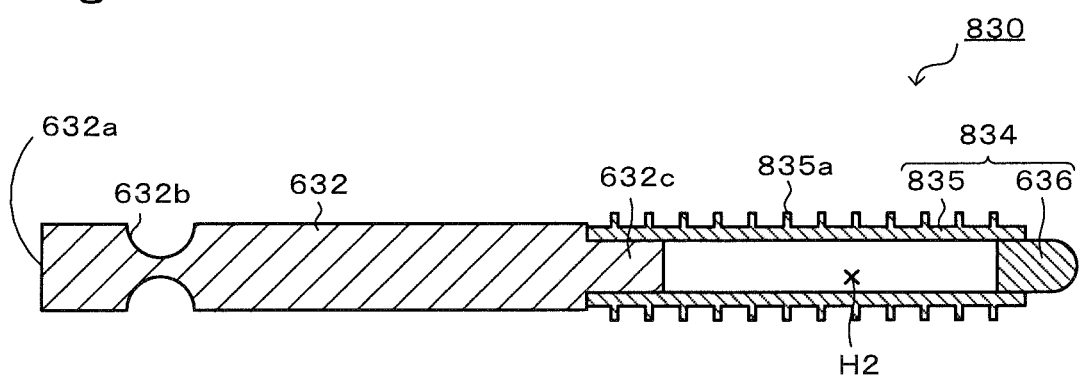
FIG. 15 is a sectional view of an RF rod 830.

In the above-described embodiment, instead of the RF rod 30, an RF rod 730 illustrated in FIG. 14 may be employed. The RF rod 730 includes a second rod member 734 having a threaded peripheral wall 735. Alternatively, an RF rod 830 illustrated in FIG. 15 may be employed. The RF rod 830 has a second rod member 834 having fins 835a on a peripheral wall 835. Alternatively, instead of the RF rod 30, an RF rod having a second rod member having recesses and protrusions on the peripheral wall may be employed. This increases the surface area of the second rod member, further readily reducing an increase in the temperature of the second rod member. In FIGS. 14 and 15, the same reference numerals are assigned to the same components as those illustrated in FIG. 13 without explanation of the components.

In the above-described embodiment, the second rod member 34 is made of tungsten, but the material of the second rod member 34 is not limited to this. For example, in the above-described embodiment, the second rod member 34 may be made of austenitic stainless steel or Inconel. This enables the second rod member 34 to be joined to the first rod member 32 made of Ni by welding. Alternatively, the second rod member 34 may be made of a material containing a titanium group element, a copper group element, a chromium group element, austenitic stainless steel, Inconel, or Hastelloy. This enables the second rod member 34 to be joined to the first rod member 32 made of Ni by solid-state welding such as ultrasonic welding and friction stir welding.

The present application claims priority from Japanese Patent Application No. 2021-062560, filed on Apr. 1, 2021, the entire contents of which are incorporated herein by reference.

What is claimed is:

1. A wafer support table comprising:
   a ceramic base having a wafer placement surface and including an RF electrode and a heater electrode embedded, the RF electrode being closer to the wafer placement surface;
   a hole extending from a surface of the ceramic base opposite the wafer placement surface toward the RF electrode; and
   an RF rod through which radio-frequency power is supplied to the RF electrode and having a top end joined to the RF electrode exposed to a bottom of the hole or joined to a conductive member connected to the RF electrode, wherein
   the RF rod is a hybrid rod including a first rod member that is made of Ni and constitutes a portion of the RF rod from the top end to a predetermined position located between the top end and a base end and a second rod member that is joined to the first rod member and constitutes a portion of the RF rod from the predetermined position to the base end, and
   the second rod member is made of a non-magnetic material.

2. The wafer support table according to claim 1, wherein the predetermined position is determined by using a rod made of Ni, instead of the hybrid rod, and is a position where $T(x)$ represented by $T(x)=T_s-(\Delta T/L)*x$ is greater than or equal to Curie temperature of Ni and lower than or equal to oxidation temperature of the non-magnetic material, where Ts [° C.] is a temperature of the heater electrode (provided that Ts exceeds the Curie temperature of Ni), L [cm] is a length of the rod made of Ni, $\Delta T$ [° C.] is a difference in temperature between ends of the rod made of Ni, x [cm] is a length of the rod made of Ni from the top end to the predetermined position, and $T(x)$ [° C.] is a temperature of the rod made of Ni at the predetermined position.

3. The wafer support table according to claim 1, wherein the second rod member has at an end thereof a protrusion tapered to gradually decrease in width toward the base end of the RF rod, and
   the protrusion of the second rod member fits in a recess at an end of the first rod member to form the RF rod.

4. The wafer support table according to claim 1, wherein the first rod member has at an end thereof a protrusion tapered to gradually decrease in width toward the top end of the RF rod, and
   the protrusion of the first rod member fits in a recess at an end of the second rod member to form the RF rod.

5. The wafer support table according to claim 1, wherein the second rod member is made of tungsten.

6. The wafer support table according to claim 1, wherein the RF rod has a hollow section.

7. The wafer support table according to claim 6, wherein the second rod member has the hollow section, and
   a peripheral wall defining the hollow section is made of tungsten ribbon or tungsten mesh.

8. The wafer support table according to claim 1, wherein the first rod member has a narrow portion near a top end thereof.

9. An RF rod that is a hybrid rod comprising:
   a first rod member that is made of Ni and constitutes a portion of the RF rod from a top end to a predetermined position located between the top end and a base end and a second rod member that is joined to the first rod member and constitutes a portion of the RF rod from the predetermined position to the base end, wherein
   the second rod member is made of a non-magnetic material.

* * * * *